US011169211B2

(12) United States Patent
Manson et al.

(10) Patent No.: US 11,169,211 B2
(45) Date of Patent: Nov. 9, 2021

(54) SYSTEMS, METHODS AND APPARATUSES FOR FREQUENCY TRACKING

(71) Applicant: Schweitzer Engineering Laboratories, Inc., Pullman, WA (US)

(72) Inventors: Scott M. Manson, Moscow, ID (US); Ellery A. Blood, Moscow, ID (US); Gregary C. Zweigle, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 120 days.

(21) Appl. No.: 16/601,261

(22) Filed: Oct. 14, 2019

(65) Prior Publication Data

US 2021/0109158 A1 Apr. 15, 2021

(51) Int. Cl.
*G01R 31/34* (2020.01)
*G01P 3/48* (2006.01)

(52) U.S. Cl.
CPC .......... *G01R 31/343* (2013.01); *G01P 3/4802* (2013.01)

(58) Field of Classification Search
CPC ............................ G01R 31/343; G01P 3/4802
See application file for complete search history.

(56) References Cited

U.S. PATENT DOCUMENTS

| | | | | |
|---|---|---|---|---|
| 5,680,409 A | * | 10/1997 | Qin | G05B 9/02 702/116 |
| 6,981,423 B1 | | 1/2006 | Discenzo | |
| 2004/0227486 A1 | * | 11/2004 | Kerlin | H02K 99/20 318/807 |
| 2005/0021302 A1 | | 1/2005 | Dimino | |
| 2005/0180862 A1 | | 8/2005 | Lando | |
| 2006/0038530 A1 | * | 2/2006 | Holling | H02P 23/14 318/807 |
| 2010/0320763 A1 | | 12/2010 | Li | |
| 2016/0187425 A1 | | 6/2016 | Fahringer | |
| 2018/0076753 A1 | | 3/2018 | Donolo | |

OTHER PUBLICATIONS

PCT/US2020/053355 Patent Cooperation Treaty, International Search Report and Written Opinion of the International Searching Authority, dated Jan. 5, 2021.
G.C. Gant, G.J. Alves "Progress in Electronic Control of Large Diesel Engines", Transactions of the ASME, Jul. 1990, p. 280-286, vol. 112.
Tomohiro Iwai, et al. "The Development of an Electronic Governor for the Power Generator System", SAE Technical Paper Series, Sep. 1990, Society of Automation Engineers, Inc.
Minghui Kao, John J. Moskwa "Nonlinear Diesel Engine Conlrol and Cylinder Pressure Observation" Journal of Dynamic Systems, Measurement and Control, Jun. 1995, p. 183-192, vol. 117.

(Continued)

*Primary Examiner* — Kyle R Quigley
(74) *Attorney, Agent, or Firm* — Stoel Rives LLP

(57) ABSTRACT

A frequency tracking system may use shaft speed and electrical frequency to estimate a frequency of a monitored machine. The frequency tracking system may convert shaft speed to a mechanical frequency and blend the electrical frequency and the mechanical frequency together to determine an estimated frequency. The frequency tracking system may blend the frequencies based on an operating state of the monitored machine and the frequency sensors.

16 Claims, 5 Drawing Sheets

(56) References Cited

OTHER PUBLICATIONS

Kiyong Kim, Jeff Burnworth "Load Anticipation Feature and Its Tuning Method for a Diesel Generating Set" 2016 Clemson University Power Systems Conference (PSC), Mar. 2016. IEEE, Clemson, SC, USA.
Wenhua Liu, et al. "Integrated Optimal Control of Speed, Excitation and Load Sharing of Parallel Operating Diesel Generator Sets" IEE 2nd International Conference on Advances in Power System Control, Operation and Management, Dec. 1993, p. 142-146, IEE, Hong Kong.

\* cited by examiner

SYSTEMS, METHODS AND APPARATUSES FOR FREQUENCY TRACKING

TECHNICAL FIELD

The present disclosure relates generally to the field of frequency tracking of synchronous machines.

BRIEF DESCRIPTION OF THE SEVERAL VIEWS OF THE DRAWINGS

Additional aspects and advantages will be apparent from the following detailed description of preferred embodiments, which proceeds with reference to the accompanying drawings, in which.

Figure 1:
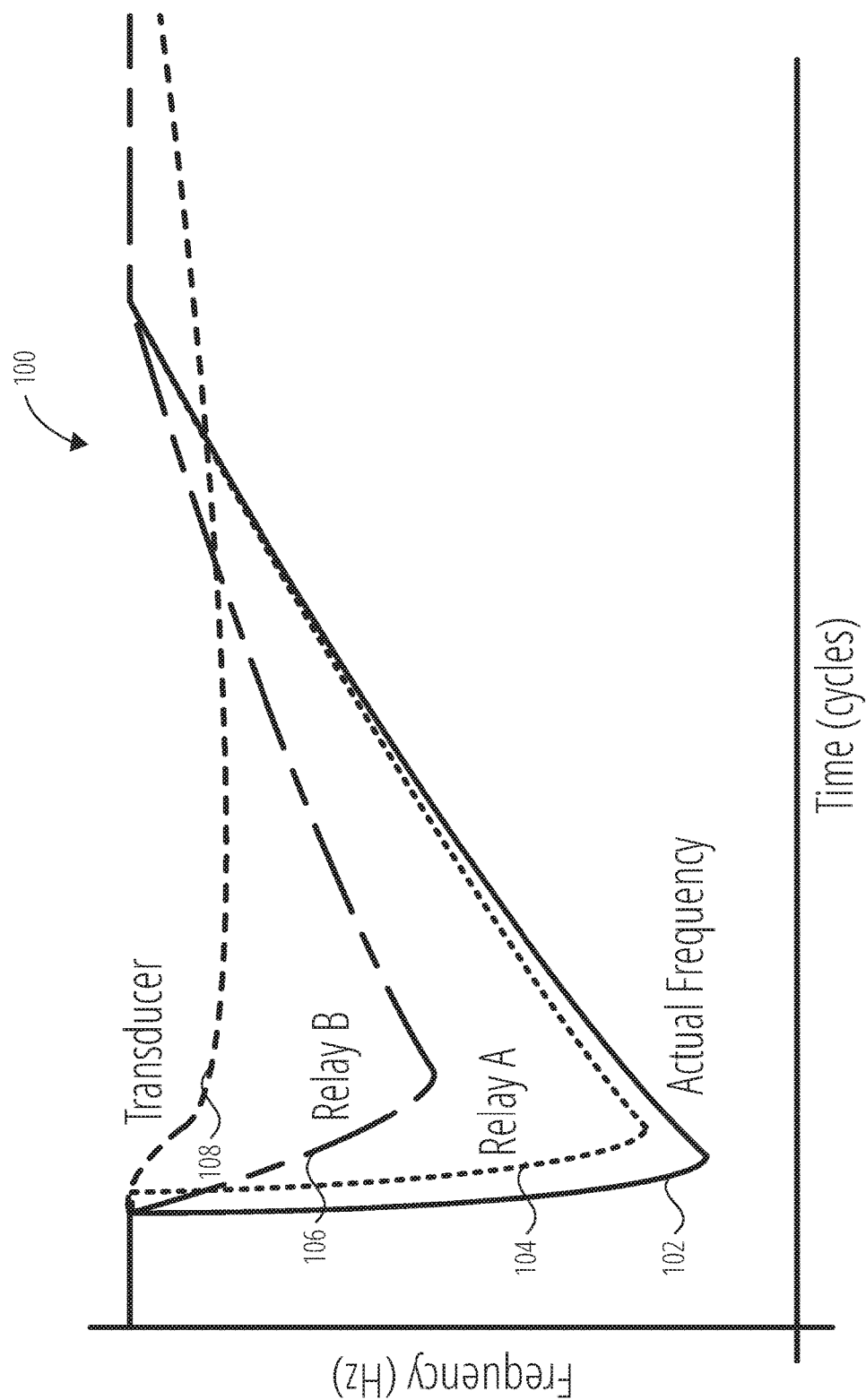
FIG. 1 illustrates a frequency tracking graph depicting measurement lag introduced by filtering and frequency locking techniques in accordance with one embodiment.

To easily identify the discussion of any particular element or act, the most significant digit or digits in a reference number refer to the figure number in which that element is first introduced.

DETAILED DESCRIPTION

Modern microprocessor relays keep a running estimate of power system frequency. This estimate can be derived from an alternating current (AC) voltage waveform using several techniques. One technique includes a relay to measure the time between zero crossings or offset-zero crossings of the voltage waveform and then filtering the measurements. Frequency is estimated using the inverse of the time between crossings. Frequency is then tracked in relays with techniques such as phase locked loops (PLL) or observers designed to reject bad zero crossing data.

Elaborate filtering techniques are employed to improve the reliability of the frequency measurement. This results in a system that will not detect a sudden frequency change until varying times after the change has occurred. Depending on the frequency estimation algorithm and subsequent filtering, frequency is typically estimated with delay in the range of 20 to 200 milliseconds. Typically, shorter delay is associated with accuracy trade-offs under non-ideal conditions.

Frequency measurement is an important function of relays. This is because frequency is used in the data processing of current and voltage measurements. For example, in some relays a cosine filter is driven by a frequency measurement algorithm. The outputs of the cosine filter are the 60 Hz components of the power system current and voltage, which are used for most metering and all protection functions.

During fault conditions or transients associated with switching, the voltage waveform can become so distorted that frequency measurements become inaccurate. Distortions such as sudden changes in voltage and current magnitudes, DC offset, and high-frequency components are common. Thus, heavy filtering and hold-over techniques are built into protective relays to ensure a reliable measure of electrical frequency is maintained. For example, most relays will lock the frequency to the last known state until the frequency is proven stable for several power system cycles.

However, lags in frequency measurements can result in protection misoperation. Compounding this problem, modern power systems have lower inertia due to the concentration of inverter-based distributed energy resources such as batteries, photovoltaics (PV), Type IV wind turbines, and others. Similarly, small rooftop solar PV installations may be designed to shut down in response to frequency deviations, further exacerbating the extent of a transient. These lower inertia power systems can have rapid frequency changes that create problems with frequency tracking and protection reliability when relying on methods such as frequency locking due to the lag in frequency measurements.

The systems, apparatuses, and methods described herein may provide reliable frequency measurements even during transient and fault conditions. In some embodiments, the systems, apparatuses, and methods described herein may use both the voltage waveform and machine speed measurements. For example, a frequency tracking device may receive shaft speed and position data from a first sensor and convert the shaft speed and position data to a rotational frequency of the shaft. Additionally, the frequency tracking device may receive stator voltage frequency from a second sensor. The frequency tracking device may blend the stator voltage frequency and the rotational frequency based on a current operating state to determine a blended frequency measurement. The blended frequency measurement may provide a reliable frequency estimation with little lag.

The phrases "coupled to," "connected to," and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term intelligent electronic device (IED) may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term IED may be used interchangeably to describe an individual IED or a system comprising multiple IEDs. The frequency tracking devices and systems described herein may be a component of an IED or in communication with a separate IED.

Aspects of certain embodiments described herein may be implemented as software modules or components. As used herein, a software module or component may include any type of computer instruction or computer-executable code located within or on a computer-readable storage medium, such as a non-transitory computer-readable medium. A software module may, for instance, comprise one or more physical or logical blocks of computer instructions, which may be organized as a routine, program, object, component, data structure, etc., that perform one or more tasks or implement particular data types, algorithms, and/or methods.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. In addition, the steps of a method do not necessarily need to be executed in any specific order, or even sequentially, nor need the steps be executed only once, unless otherwise specified.

FIG. 1 illustrates a frequency tracking graph 100 in accordance with one embodiment. The frequency tracking graph 100 illustrates the effect of lagging measurements caused by filtering, PLLs, and other signal processing on frequency used in relays and other IEDs. The frequency tracking graph 100 shows how frequency tracking varies by manufacturer of relays, meters, and transducers. The frequency tracking graph 100 shows how lags in measurement amount to inaccuracies.

The frequency tracking graph 100 includes an actual frequency 102 that is measured by a transducer, a first relay, and a second relay. The transducer produces a transducer estimated frequency 108 that fails to track closely the frequency change. The poor tracking of the transducer may result in misoperation. The second relay produces a relay B estimated frequency 106. As shown, the relay B estimated frequency 106 may have a smaller lag in frequency measurement than the transducer estimated frequency 108; however, the relay B estimated frequency 106 still includes frequency measurement lag sufficient to fail to capture the significant drop in frequency of the actual frequency 102. The frequency measurement lag may be due to filtering and hold-over techniques traditionally used in relays and transducers.

The first relay may produce a relay A estimated frequency 104 that more closely tracks the actual frequency 102 than the relay B estimated frequency 106 and the transducer estimated frequency 108. The relay A estimated frequency 104 illustrates an example output of embodiments of systems and methods to improve frequency tracking described herein. The first relay may have access to both the electrical measurements and the mechanical measurements of the machine.

Figure 2:
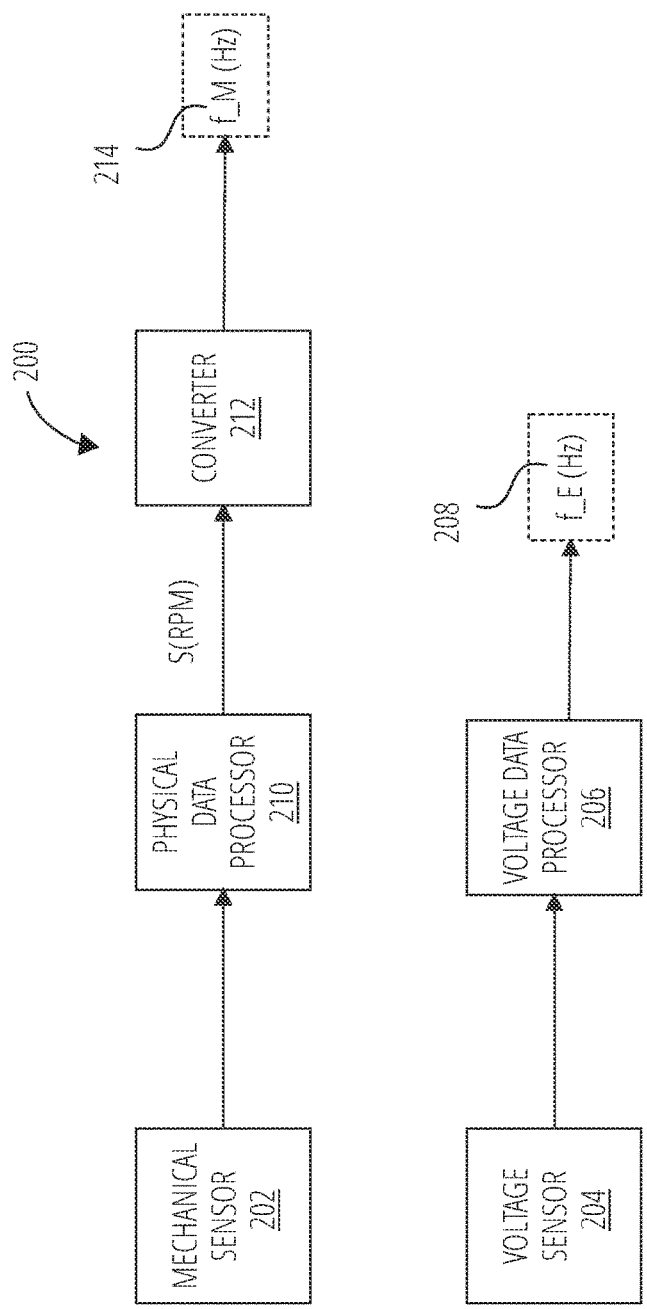
FIG. 2 illustrates a frequency measurement device in accordance with one embodiment.

FIG. 2 illustrates a frequency measurement device 200 in accordance with one embodiment. The frequency measurement device 200 may capture a mechanical frequency 214 using engine measurements (e.g., machine speed and mechanical power) and capture an electrical frequency 208 using measurements of an electrical signal.

The frequency measurement device 200 may send both the mechanical frequency 214 and the electrical frequency 208 to a frequency tracking system to provide the frequency tracking system with both the electrical measurements and the mechanical measurements of a machine. The frequency tracking system may use engine measurements to augment stator voltage frequency measurements. In some embodiments, the frequency measurement device 200 or portions of the frequency measurement device 200 are components of the frequency tracking system. In some embodiments, the frequency measurement device 200 is separate from the frequency tracking system.

A mechanical sensor 202 may take engine measurements which may include direct speed measurements and machine power measurements. The machine power measurements may indicate the operating power of a machine such as a generator or engine. In some embodiments, the machine may self-report the machine power measurements. The engine measurements may be taken from any synchronous machine, including motors and synchronous condensers. Engine measurements may be taken directly from a rotating machine or via a magnetic interface on power systems such as flywheels, diesel rotary uninterruptible power supply devices (DRUPS), wind turbines, etc. The mechanical sensor 202 may be an analog engine position sensor, a synchro, a resolver, an encoder, or other rotational position measuring device attached to an engine, a generator, or a motor. For example, the mechanical sensor 202 may be a tooth wheel magnetic sensor. Measurements of machine speed on synchronous equipment such as generators or motors can make use of measurement devices such as tooth wheels and magnetic pickups to monitor shaft speed.

The pulse information from magnetic sensors will typically be in the form of a count of the number of pulses counted within a processing interval or the duration between pulse arrival times. These values could be read directly by the physical data processor 210, or interpreted by an intermediate device which then provides a digital or analog signal to the controller.

The mechanical sensor 202 may perform well at tracking the engine speed during transients. Because the engine speed measurement is mechanical, the measurement does not rely on zero crossings of the output voltage. Thus, when a fault occurs, the mechanical sensor 202 will still be able to track the engine speed.

The engine speed measured by the mechanical sensor 202 may be processed by a physical data processor 210 to determine a speed of a machine in rotations per minute (RPM). For example, the physical data processor 210 may receive pulses from a tooth wheel magnetic sensor and measure the pulses to determine RPM of the machine. The physical data processor 210 may send the RPM measurement to a converter 212.

The tooth-wheel pulse data can be converted to a shaft speed via a variety of methods. One embodiment may use a Kalman Filter to estimate the shaft speed. Another embodiment may use an Alpha-Beta filter. Both of these embodiments are capable of generating an updated frequency estimate within one shaft rotation period or faster.

The converter 212 may receive the RPM measurement of a machine and convert the RPM measurement to the mechanical frequency 214. For example, the converter 212 may multiply the RPM measurement by the number of machine poles and divide the result by 120 RPM-poles per Hz. The converter 212 may output the mechanical frequency 214 to a frequency tracking system (e.g., frequency tracking system 300 of FIG. 3).

The mechanical frequency 214 represents a frequency of the machine estimated based on mechanical rotation of a component of the machine such as a shaft. The mechanical frequency 214 may track the mechanical shaft position. However, the mechanical frequency 214 may not precisely represent the electrical angle as the angle will deviate based on power draw and voltage magnitude.

A voltage sensor 204 may measure voltage on the same machine that the mechanical sensor 202 is tracking engine speed. The voltage sensor 204 may send voltage measurements to a voltage data processor 206. The voltage measurements may be of the stator voltage. The voltage data processor 206 may process the voltage measurements to determine the electrical frequency 208. The electrical frequency 208 may be a stator voltage frequency. For example, the voltage data processor 206 may use a zero crossing technique. In some embodiments, the voltage data processor 206 measures the time between zero crossings or offset-zero crossings of the voltage waveform. In some embodiments, the voltage data processor 206 may filter the electrical frequency 208. In some embodiments, the voltage data processor 206 may not filter the electrical frequency 208, and the frequency tracking system may use a comparison between the mechanical frequency 214 and the electrical frequency 208 to determine faulty measurements.

Figure 3:
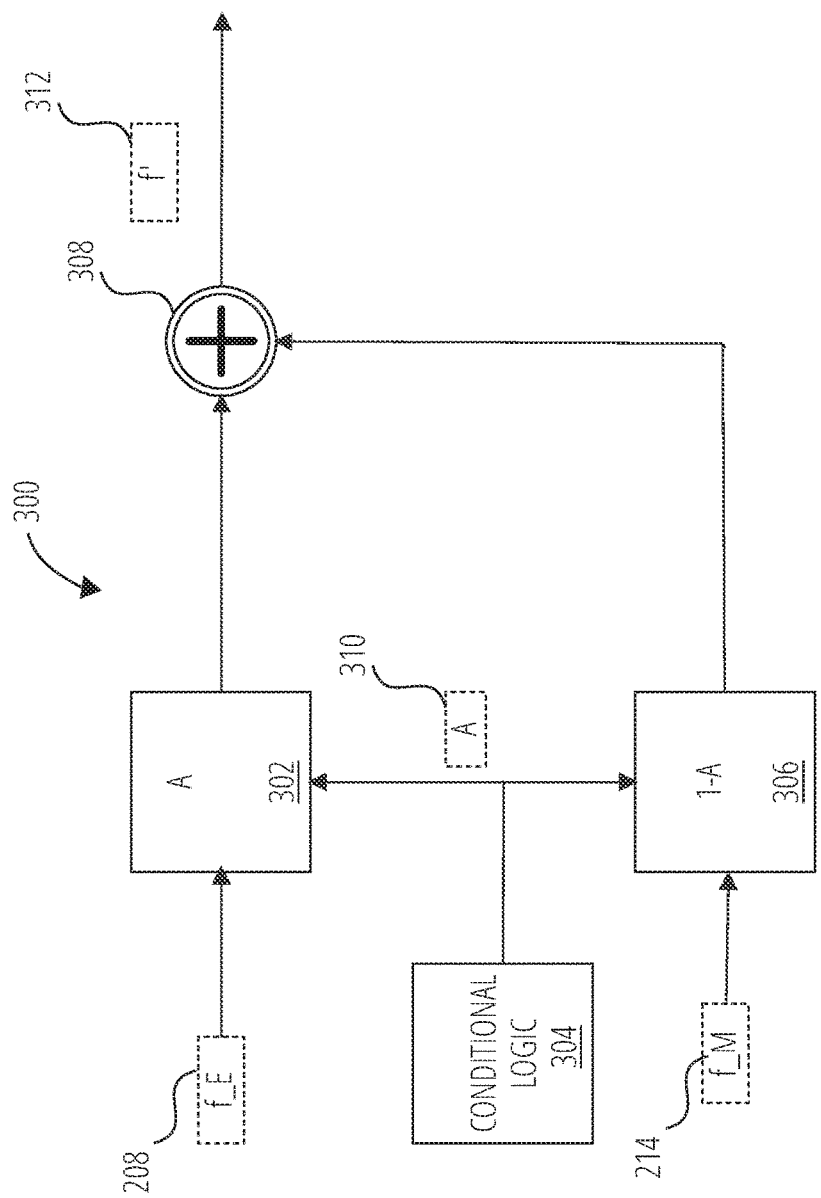
FIG. 3 illustrates a frequency tracking system in accordance with one embodiment.

FIG. 3 illustrates a frequency tracking system 300 in accordance with one embodiment. The frequency tracking system 300 uses engine measurements (e.g., mechanical frequency 214), which may include direct speed measurements and mechanical power, to augment stator voltage frequency measurements (e.g., electrical frequency 208). The frequency tracking system 300 may be used with any synchronous machine, including motors and synchronous condensers. The measurements can be from analog engine position sensors, synchros, resolvers, encoders, or other rotational position measuring devices attached to an engine, generator, or motor. The frequency tracking system 300 may be used with a rotating machine interface or magnetic interface to track a power system such as flywheels, DRUPS, wind turbines, etc.

In some embodiments, the frequency tracking system 300 may be used with or be part of an IED for controlling, protecting, or both controlling and protecting generators and prime movers (e.g., engines, turbines, etc.). The frequency tracking system 300 may have access to both the electrical measurements and the mechanical measurements of a machine. For example, as shown, the frequency tracking system 300 may receive the electrical frequency 208 and the mechanical frequency 214. The frequency tracking system 300 is, therefore, in a unique position to make use of both forms of measurements to optimally track system frequency.

As shaft speed measurements (e.g., tooth wheel speed measurements) are typically employed for engine governing operations and electrical frequency measurements are employed for electric power protection, the frequency tracking system 300 may be able to improve both. For example, the electrical frequency 208 will provide a redundant measurement that will provide redundancy in the event of a failed mechanical sensor (e.g., magnetic sensor). This redundancy may prevent engine runaway. The conditional logic 304 may track a status of the mechanical sensor and alert a machine of a failure. In some embodiments, a machine can continue running using a backup frequency measurement (i.e., electrical frequency 208) when the mechanical sensor fails. In some embodiments, the machine may exercise a controlled shutdown when the mechanical sensor fails. For example, the machine may signal to other machines to pick up the load as the failed machine begins its shutdown process.

Similarly, shaft speed measurements will provide additional robustness to electric power protection systems. For example, smaller machines tend to be subject to more severe accelerations than on a typical terrestrial power grid. Higher accelerations coupled with fault-induced voltage sags exacerbate the challenge of maintaining reliable frequency measurements. Furthermore, the fault-induced voltage sag reduces the maximum synchronizing torque available to maintain synchronization between the machine and the grid or between machines. Using the mechanical frequency 214 in addition to the electrical frequency 208 may provide reliable frequency measurements even during severe accelerations and fault-induced voltage sags because the mechanical frequency 214 is not susceptible to measurement failures from fault-induced voltage sag and the mechanical frequency 214 is able to quickly capture measurements during accelerations.

To improve the accuracy and reliability of frequency measurements the conditional logic 304 determines how to combine the electrical frequency 208 and the mechanical frequency 214 based on a state of the machine and sensors. The conditional logic 304 provides a combination factor 310 that is used to blend the electrical frequency 208 (e.g., stator voltage frequency data) and the mechanical frequency 214 (e.g., shaft frequency) based on the current operating state. In some embodiments, the combination factor 310 may be used as a first parameter 302 to multiply with the electrical frequency 208 to obtain a stator frequency product. Similarly, one minus the combination factor 310 may be used as a second parameter 306 to multiply with the mechanical frequency 214 to obtain a shaft frequency product. In other embodiments, the first parameter 302 may be one minus the combination factor 310 and the second parameter 306 may be the combination factor 310. A first adder 308 combines the stator frequency product and the shaft frequency product to produce a blended frequency 312 that the frequency tracking system 300 may use as an estimated frequency.

The operational state of the machine and or sensors may cause the combination factor 310 to change an influence of the electrical frequency 208 or the mechanical frequency 214 on the blended frequency 312. For example, in some embodiments, during normal operation, the combination factor 310 may be 0.5, causing the blended frequency 312 to be an equal combination of the electrical frequency 208 and the mechanical frequency 214. In some embodiments, the conditional logic 304 may generate the combination factor 310 to favor one or the other of the electrical frequency 208 and the mechanical frequency 214 during normal operating conditions. For example, during normal operating conditions, the combination factor 310 may be 1, causing the blended frequency 312 to be equal to the electrical frequency 208.

During a startup conditions, transient conditions, or fault conditions, the conditional logic 304 may output a value for the combination factor 310 that causes the second parameter 306 to be greater than the first parameter 302 (e.g., combination factor 310 less than 0.5), causing the blended frequency 312 to favor the mechanical frequency 214. For example, during when the frequency rapidly changes, the combination factor 310 may be 0.2. In some embodiments, during one or more of a startup condition, transient condition, or fault condition, the combination factor 310 may be zero, causing the blended frequency 312 to be equal to the mechanical frequency 214. In other words, the conditional logic 304 may reduce an influence of the stator voltage frequency on the blended frequency 312 during the transient condition and the fault condition.

In some embodiments, the conditional logic 304 may change the combination factor 310 based on a sensor failure. For example, if the mechanical sensor fails, the combination factor 310 may be 1, causing the blended frequency 312 to be equal to the electrical frequency 208. If the voltage sensor fails, the combination factor 310 may be zero, causing the blended frequency 312 to be equal to the mechanical frequency 214. In some embodiments, the frequency tracking system 300 may provide a failure alert during the first sensor fault condition and the second sensor fault condition. The alert may be sent to a graphical user interface, a personal electronic device, or the machine.

The conditional logic 304 may determine the operating state of the machine and the sensors. In some embodiments, the conditional logic 304 compares the electrical frequency 208 and the mechanical frequency 214 and determines the operating state based on a difference between the stator voltage frequency and the shaft-measured frequency. For example, the conditional logic 304 may detect a transient condition when the mechanical frequency 214 changes at a faster rate than the electrical frequency 208. For example, if a difference in rate changes exceeds a certain threshold, the conditional logic 304 may determine a transient condition. In some embodiments, the combination factor 310 may be proportional to the difference in rate changes during the transient condition. For example, the combination factor 310 may be close to zero when the difference in rate changes is large and less when the difference is less.

The conditional logic 304 may detect a startup condition when the values of the mechanical frequency 214 or the electrical frequency 208 change after a period of time at zero. During the startup condition, the conditional logic 304 may gradually or incrementally increase the influence of the electrical frequency 208 as the time after startup progresses. For example, during an initial stage of the startup the combination factor 310 may be close to zero and the conditional logic 304 may increase the combination factor 310 based on startup time.

The conditional logic 304 may detect a fault condition when the electrical frequency 208 is significantly different than the mechanical frequency 214. For example, if the difference between the electrical frequency 208 and the mechanical frequency 214 exceeds a target threshold, the conditional logic 304 may determine that a fault has occurred and that the electrical frequency 208 is not properly measuring the frequency because of the fault. During the fault condition, the conditional logic 304 may favor the mechanical frequency 214.

The conditional logic 304 may detect a sensor failure when one of the sensors is not measuring frequency (e.g., electrical frequency 208 or mechanical frequency 214) while the other sensor is measuring a frequency. The conditional logic 304 may discard the failed sensor data by changing the combination factor 310.

Thus, several techniques are used to indicate transient response and drive the conditional logic 304. For example, the difference between the electrical frequency 208 and the mechanical frequency 214 may be used by the conditional logic 304 as an indication of transient machine response, sensor failure, fault condition, or startup condition.

Additionally, different measurements may exhibit variable accuracy as a function of frequency.

Figure 4:
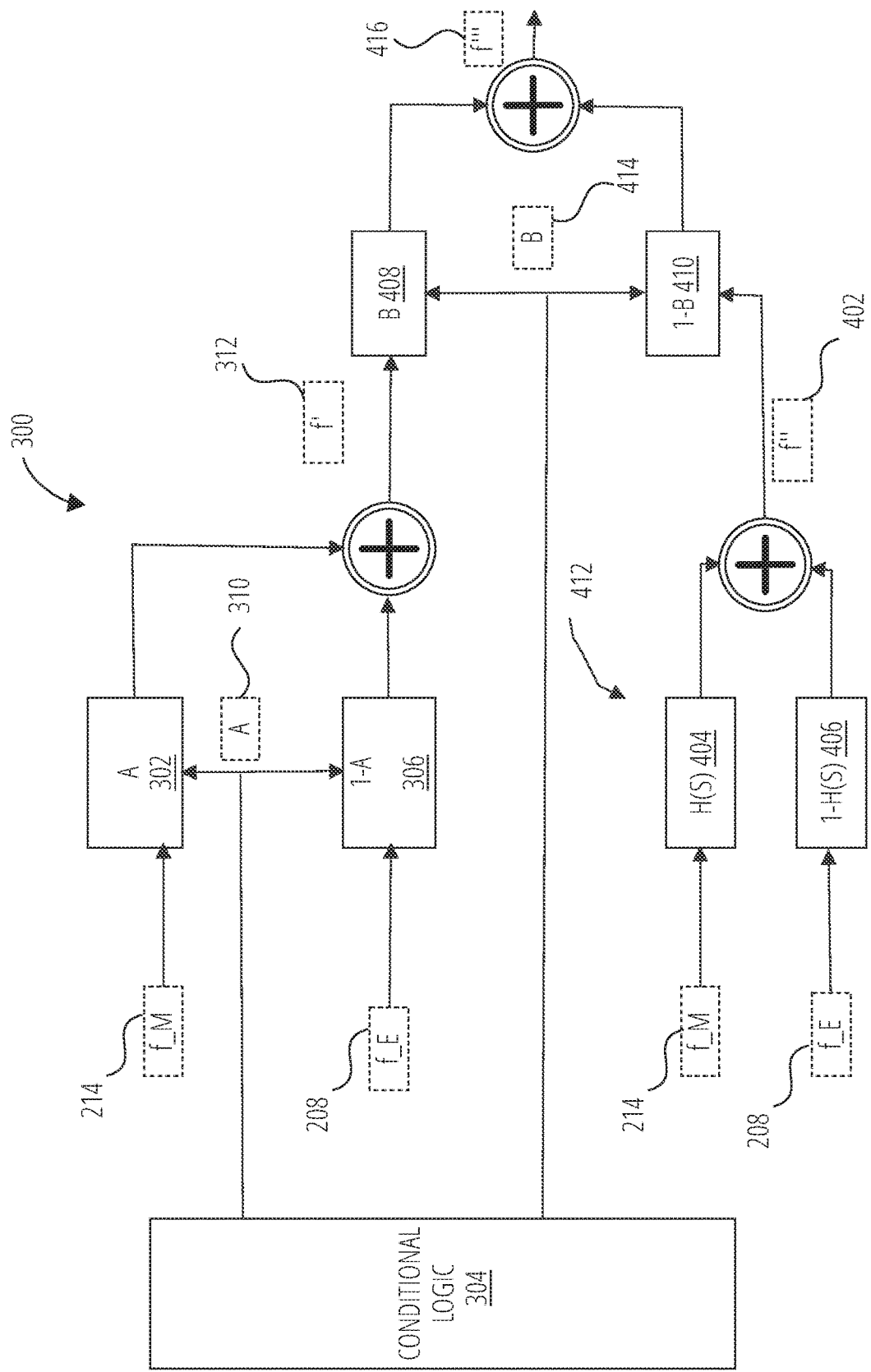
FIG. 4 illustrates a frequency tracking system in accordance with one embodiment.

FIG. 4 illustrates one embodiment of the frequency tracking system 300 in combination with an additional state complimentary filter that combines the output (i.e., blended frequency 312) of the first state complimentary filter (i.e., the frequency tracking system 300) with another estimate of frequency (i.e., 3rd frequency measurement 402). In one embodiment, the additional frequency estimate (3rd frequency measurement 402) could come from a combination of mechanical frequency 214 and electrical frequency 208 as performed by a traditional complimentary filter (i.e., traditional complimentary filter 412). As described with reference to FIG. 3, the frequency tracking system 300 may output a blended frequency 312.

The contribution to the estimated frequency 404 of the two measurements (i.e., electrical frequency 208 and mechanical frequency 214) can be combined by employing filters with complementary frequency responses using a traditional complimentary filter 412. For example, a low-pass filter H(s) 404 may be applied to the mechanical frequency 214. The complement of H(s) 404 would then be 1-H(s) 406 which realizes a high-pass filter. 1-H(s) 406 may be applied to the electrical frequency 208. The output signals of the high pass filter and the low pass filter may be added together to create a 3rd frequency measurement 402 with different characteristics than either mechanical frequency 214 or electrical frequency 208. A second set of state complimentary filter logic (i.e., B 408 and 1-B 410) using combination factor B 414 may be applied to merge the output f" 402 from this filter with the output from the state complimentary filter implemented above (i.e., blended frequency f' 312) and the results may be added to produce an estimated frequency f'" 416. In this way, any number of signals may be seamlessly combined to provide the best frequency estimate. A variety of complementary filters could be employed that implement different frequency responses; the filters may be selected between based on the machine state or condition.

Similarly, multiple signals can be combined in a single stage by choosing a plurality of gains that sum to 1. The hierarchical system of FIG. 4 may be realized with the following gains, BA, B(1-A), and (1-B). The gains A and B could independently be derived from separate condition indicators, or as a combined condition assessment process.

Thus, the frequency tracking system 300 blends the best of speed and stator voltage frequency measurements. The frequency tracking system 300 considers many aspects regarding signal quality and response. For example, the frequency tracking system 300 may include a high-pass filtering for the RPM-derived frequency (i.e., mechanical frequency 214) as RPM accurately captures the fast transient response of frequency. However, the RPM-derived frequency does not accurately show the power angle (angle between rotor and electrical phasor). Further, the frequency tracking system 300 can use the electrical angle from the electrical frequency 208 because it represents electrical angle well, except during a transient. Thus, the frequency tracking system 300 may use the mechanical frequency 214 during a transient and estimate the angle based on the angle of the electrical frequency 208 before the transient.

The mechanical frequency 214 captures the fast transient response of frequency and is fault resilient. The frequency tracking system 300 may disregard the electrical frequency 208 information during transient or fault conditions and instead focuses on the mechanical frequency 214 information. Under transient and steady-state conditions the conditional logic 304 causes the frequency tracking system 300 to use the measurement most applicable via a selection approach (e.g., combination factor A 310).

During faulted conditions, the ability to accurately measure machine speed is not affected and will provide reliable frequency measurements. The estimated frequency may be stable transiently and accurate during faulted circuit conditions because of the machine speed measurement captured in the mechanical frequency 214.

The frequency tracking system 300 may include a processor (which may be a microprocessor, field programmable gate array (FPGA), application-specific integrated circuit (ASIC), or the like) that may be configured to coordinate one or more desired functions (e.g., measure, compare, analyze, normalize, etc.). A processor may perform distributed (e.g., parallel) processing to execute or otherwise implement functionalities of the present embodiments. A processor may run a standard operating system and perform standard operating system functions. It is recognized that any standard operating system may be used, such as, for example, Microsoft® Windows®, Apple® MacOS®, Disk Operating System (DOS), UNIX, IRJX, Solaris, SunOS, FreeBSD, Linux®, QNX®, ffiM® OS/2®, and so forth. In some embodiments, the frequency tracking system 300 may further comprise a human media interface, which may include a display, an attached computer, or the like. The computer storage media may contain one or more input/output interfaces that facilitate HMI. The input device(s) may include a keyboard, mouse, button, touch screen, light pen, tablet, microphone, sensor, or other hardware with accompanying firmware and/or software. The output device(s) may include a monitor or other display, printer, speech or text synthesizer, switch, signal line, graphical user interface, or other hardware with accompanying firmware and/or software.

The frequency tracking system 300 may be implemented as software modules or components. A software module or component may include any type of computer instruction or computer-executable code located within or on a computer-readable storage medium. A software module may, for instance, comprise one or more physical or logical blocks of computer instructions, which may be organized as a routine, a program, an object, a component, a data structure, etc., that perform one or more tasks or implement particular abstract data types. A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media.

The frequency tracking system 300 may function as one or more modules. A module may include all or portions of other elements of the frequency tracking system 300. The modules may run multiple operations concurrently or in parallel by or on one or more processors. Portions of the disclosed modules, components, and/or facilities are embodied as executable instructions embodied in hardware or firmware, or stored on a non-transitory, machine-readable storage medium. The instructions may comprise computer program code that, when executed by a processor and/or computing device, causes a computing system to implement certain processing steps, procedures, and/or operations, as disclosed herein. The modules, components, and/or facilities disclosed herein may be implemented and/or embodied as a driver, a library, an interface, an API, FPGA configuration data, firmware (e.g., stored on an EEPROM), and/or the like. Portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like. Accordingly, the modules may be referred to as controllers, layers, services, engines, facilities, drivers, circuits, and/or the like.

Figure 5:
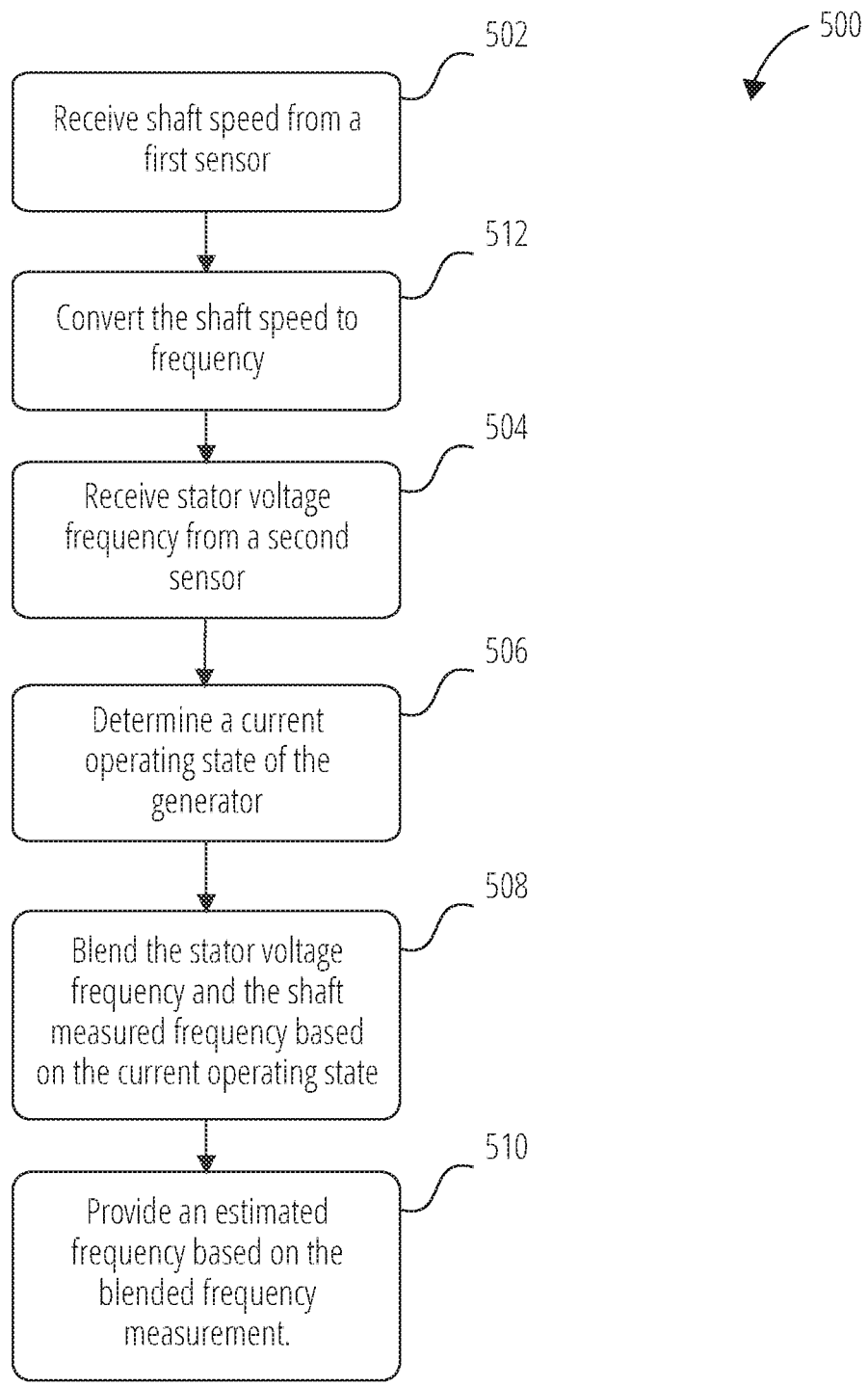
FIG. 5 illustrates a flow chart of a method for tracking frequency in accordance with one embodiment.

FIG. 5 illustrates a flow chart of a method 500 for tracking frequency in accordance with one embodiment. The method 500 may be stored on a memory as computer-executable code to be executed. The method 500 may be executed by a processor, IED, or other system. For example, the frequency tracking system 300 as described in FIG. 3 may use the method 500.

A frequency tracking system may receive 502 shaft speed from a plurality of sensors. The frequency tracking system may convert 512 the shaft speed to a shaft-measured frequency. The frequency tracking system may also receive 504 stator voltage frequency from a second sensor. The frequency tracking system determines 506 a current operating state of the generator, and blends 508 the stator voltage frequency and the shaft-measured frequency based on the current operating state to determine a blended frequency measurement. The frequency tracking system provides 510 an estimated frequency based on the blended frequency measurement.

In some embodiments, the method may further include multiplying the stator voltage frequency by a factor to obtain a stator product, and multiplying the shaft-measured frequency by one minus the factor to obtain a shaft product. The frequency tracking system can sum the stator product and the shaft product. The factor may be determined based on the current operating state of the generator.

In some embodiments, the current operating state includes a transient condition and a fault condition. In these embodiments, blending the stator voltage frequency and the shaft-measured frequency may include reducing an influence of the stator voltage frequency on the blended frequency measurement during the transient condition and the fault condition.

In some embodiments, the current operating state includes a first sensor fault condition and a second sensor fault condition. The frequency tracking system uses the stator voltage frequency during a first sensor fault condition as the blended frequency, and uses the shaft-measured frequency during a second sensor fault condition as the blended frequency.

In some embodiments, the method 500 may further include estimating a frequency slip between the shaft-measured frequency and the stator voltage frequency, and correcting a power angle of the shaft-measured frequency using the frequency slip.

In some embodiments, the method 500 may determine the operating state is based on a difference between the stator voltage frequency and the shaft-measured frequency.

The foregoing specification has been described with reference to various embodiments, including the best mode. However, those skilled in the art appreciate that various modifications and changes can be made without departing from the scope of the present disclosure and the underlying principles of the invention. Accordingly, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "couple," and any other variation thereof are intended to cover a physical connection, an electrical connection, a magnetic connection, an optical connection, a communicative connection, a functional connection, and/or any other connection.

Principles of the present disclosure may be reflected in a computer program product on a tangible computer-readable storage medium having computer-readable program code means embodied in the storage medium. Any suitable computer-readable storage medium may be utilized, including magnetic storage devices (hard disks, floppy disks, and the like), optical storage devices (CD-ROMs, DVDs, Blu-Ray discs, and the like), flash memory, and/or the like. These computer program instructions may be loaded onto a general purpose computer, special purpose computer, or other programmable data processing apparatus to produce a machine, such that the instructions that execute on the computer or other programmable data processing apparatus create means for implementing the functions specified. These computer program instructions may also be stored in a computer-readable memory that can direct a computer or other programmable data processing apparatus to function in a particular manner, such that the instructions stored in the computer-readable memory produce an article of manufacture including instruction means which implement the function specified. The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions specified.

Principles of the present disclosure may be reflected in a computer program implemented as one or more software modules or components. As used herein, a software module or component (e.g., engine, system, subsystem) may include any type of computer instruction or computer-executable code located within a memory device and/or computer-readable storage medium. A software module may, for instance, comprise one or more physical or logical blocks of computer instructions, which may be organized as a routine, a program, an object, a component, a data structure, etc., that perform one or more tasks or implement particular data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

Suitable software to assist in implementing the invention is readily provided by those of skill in the pertinent art(s) using the teachings presented here and programming languages and tools, such as Java, Pascal, C++, C, database languages, APIs, SDKs, assembly, firmware, microcode, and/or other languages and tools.

Embodiments as disclosed herein may be computer-implemented in whole or in part on a digital computer. The digital computer includes a processor performing the required computations. The computer further includes a memory in electronic communication with the processor to store a computer operating system. The computer operating systems may include, but are not limited to, Microsoft® Windows®, Apple® MacOS®, Disk Operating System (DOS), UNIX, IRJX, Solaris, SunOS, FreeBSD, Linux®, QNX®, ffiM® OS/2®, and so forth. Alternatively, it is expected that future embodiments will be adapted to execute on other future operating systems.

In some cases, well-known features, structures, or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

While the principles of this disclosure have been shown in various embodiments, many modifications of structure, arrangements, proportions, elements, materials, and components, used in practice, which are particularly adapted for a specific environment and operating requirements, may be used without departing from the principles and scope of this disclosure. These and other changes or modifications are intended to be included within the scope of the present disclosure.

The scope of the present invention should, therefore, be determined only by the following claims.

What is claimed is:

1. A frequency tracking system comprising:
a first sensor to monitor shaft speed of a monitored machine;
a second sensor to measure stator voltage frequency of the monitored machine; and
processing circuitry to:
convert the shaft speed to a shaft-measured frequency;
determine a current operating state of the monitored machine;
blend the stator voltage frequency and the shaft-measured frequency based on the current operating state to determine a system frequency measurement, wherein blending the stator voltage frequency and the shaft-measured frequency comprises:
multiplying the stator voltage frequency by a factor to obtain a stator product, multiplying the shaft-measured frequency by one minus the factor to obtain a shaft product, and
summing the stator product and the shaft product,
wherein the factor is determined by the current operating state of the monitored machine; and
provide the system frequency measurement as an estimated frequency; and
an intelligent electronic device (TED) to process current and voltage measurements using the system frequency measurement to control or protect the monitored machine.

2. The frequency tracking system of claim 1, wherein the current operating state includes a transient condition and a fault condition, and
wherein to blend the stator voltage frequency and the shaft-measured frequency the processing circuitry is to:
reduce an influence of the stator voltage frequency on the system frequency measurement during the transient condition and the fault condition.

3. The frequency tracking system of claim 1, wherein the current operating state includes a first sensor fault condition and a second sensor fault condition, and
wherein to blend the stator voltage frequency and the shaft-measured frequency the processing circuitry is to:
use the stator voltage frequency during the first sensor fault condition as the system frequency, and
use the shaft-measured frequency during the second sensor fault condition as the system frequency.

4. The frequency tracking system of claim 3, wherein the processing circuitry is further to provide a failure alert during the first sensor fault condition and the second sensor fault condition.

5. The frequency tracking system of claim 1, wherein the processing circuitry is further to:
blend one or more additional signals with the stator voltage frequency and the shaft-measured frequency to determine a system frequency measurement.

6. The frequency tracking system of claim 1, wherein the processing circuitry is further to determine the operating state based on a difference between the stator voltage frequency and the shaft-measured frequency.

7. A frequency tracking device comprising:
a first input to receive shaft speed data from a first sensor;
a second input to receive electrical frequency data from a second sensor; and
processing circuitry to:
convert the shaft speed data to a shaft-measured frequency;
determine a current operating state of a monitored machine;
blend the electrical frequency data and the shaft-measured frequency based on the current operating state to determine a system frequency estimate, wherein blending the stator voltage frequency and the shaft-measured frequency comprises:
multiplying the stator voltage frequency by a factor to obtain a stator product,
multiplying the shaft-measured frequency by one minus the factor to obtain a shaft product, and
summing the stator product and the shaft product,
wherein the factor is determined by the current operating state of the monitored machine,
wherein the current operating state includes a first sensor fault condition and a second sensor fault condition, and wherein to blend the stator voltage frequency and the shaft-measured frequency the processing circuitry is to:
use the stator voltage frequency during the first sensor fault condition as the system frequency, and
use the shaft-measured frequency during the second sensor fault condition as the system frequency; and
provide the system frequency estimate as an estimated frequency to an intelligent electronic device (TED) for processing of current and voltage measurements for controlling or protecting the monitored machine.

8. The frequency tracking device of claim 7, wherein the current operating state includes a transient condition and a fault condition, and
wherein to blend the electrical frequency and the shaft-measured frequency the processing circuitry is to:
reduce an influence of the electrical frequency on the system frequency estimate during the transient condition and the fault condition.

9. The frequency tracking device of claim 7, wherein the processing circuitry is further to provide a failure alert during the first sensor fault condition and the second sensor fault condition.

10. The frequency tracking device of claim 7, wherein the processing circuitry is further to:
blend one or more additional signals with the stator voltage frequency and the shaft-measured frequency to determine a system frequency measurement.

11. The frequency tracking device of claim 7, wherein the processing circuitry is further to determine the operating state based on a difference between the stator voltage frequency and the shaft-measured frequency.

12. A method to track frequency, the method comprising:
receiving shaft speed from a first sensor;
converting the shaft speed to a shaft-measured frequency;
receiving stator voltage frequency from a second sensor;
determining a current operating state of a monitored machine;
blending the stator voltage frequency and the shaft-measured frequency based on the current operating state to determine a blended frequency measurement, wherein blending the stator voltage frequency and the shaft-measured frequency comprises:
multiplying the stator voltage frequency by a factor to obtain a stator product,
multiplying the shaft-measured frequency by one minus the factor to obtain a shaft product, and
summing the stator product and the shaft product,
wherein the factor is determined by the current operating state of the monitored machine;
provide an estimated frequency based on the blended frequency measurement to an intelligent electronic device (IED); and
processing current and voltage measurements at the TED and controlling or protecting for controlling or protecting the monitored machine.

13. The method of claim 12, wherein the current operating state includes a transient condition and a fault condition, and
wherein blending the stator voltage frequency and the shaft-measured frequency comprises:
reducing an influence of the stator voltage frequency on the blended frequency measurement during the transient condition and the fault condition.

14. The method of claim 12, wherein the current operating state includes a first sensor fault condition and a second sensor fault condition, and
wherein blending the stator voltage frequency and the shaft-measured frequency comprises:
using the stator voltage frequency during the first sensor fault condition as the blended frequency, and using the shaft-measured frequency during the second sensor fault condition as the blended frequency.

15. The method of claim 12, further comprising:
estimating a frequency slip between the shaft-measured frequency and the stator voltage frequency, and
correcting a power angle of the shaft-measured frequency using the frequency slip.

16. The method of claim 12, wherein determining the operating state is based on a difference between the stator voltage frequency and the shaft-measured frequency.

* * * * *